United States Patent [19]
Ursic

[11] Patent Number: 5,277,366
[45] Date of Patent: Jan. 11, 1994

[54] HIGH PRESSURE FLUID JET ORIFICE MADE OF OXYGEN ENHANCED SAPPHIRE AND PROCESS FOR MAKING SAME

[76] Inventor: Thomas A. Ursic, 12 Bedford Dr., West Trenton, N.J. 08628

[21] Appl. No.: 911,108

[22] Filed: Jul. 9, 1992

[51] Int. Cl.$^5$ .................. B05B 1/00; C30B 33/02
[52] U.S. Cl. .................... 239/11; 239/596; 239/DIG. 19; 423/625; 501/86; 501/153; 156/DIG. 61; 156/DIG. 73
[58] Field of Search ......... 239/11, 596, 602, DIG. 19; 423/625; 148/DIG. 3; 501/86, 153; 156/DIG. 61, 73, 6003

[56] References Cited

U.S. PATENT DOCUMENTS

| | | | |
|---|---|---|---|
| 2,610,129 | 9/1952 | Eversole et al. | 501/86 |
| 3,705,693 | 12/1972 | Franz | 239/602 X |
| 3,950,596 | 4/1976 | Carr et al. | 501/86 X |
| 4,313,570 | 2/1982 | Olsen | 239/596 X |
| 4,510,609 | 4/1985 | Caslavsky et al. | |
| 4,660,773 | 4/1987 | O'Hanlon | 239/596 |
| 4,754,929 | 7/1988 | Struve et al. | 239/596 X |
| 4,936,512 | 6/1990 | Tremoulet, Jr. | 239/596 |
| 5,033,681 | 7/1991 | Munoz | 239/596 |

FOREIGN PATENT DOCUMENTS

| | | | |
|---|---|---|---|
| 2427429 | 12/1975 | Fed. Rep. of Germany | 501/86 |
| 595445 | 12/1947 | United Kingdom | 156/DIG. 61 |

*Primary Examiner*—Andres Kashnikow
*Assistant Examiner*—William Grant
*Attorney, Agent, or Firm*—Ostrolenk, Faber, Gerb & Soffen

[57] ABSTRACT

A fluid jet orifice and method of making same. The fluid jet orifice comprises an orifice made of sapphire, the sapphire being annealed in a high temperature oxygen atmosphere. Preferably, the high temperature is in a range of approximately 1200° C. to 1700° C., the pressure of the oxygen atmosphere is atmospheric or above, and the annealing time is from approximately 4 to 40 hours.

10 Claims, No Drawings

HIGH PRESSURE FLUID JET ORIFICE MADE OF OXYGEN ENHANCED SAPPHIRE AND PROCESS FOR MAKING SAME

BACKGROUND OF THE INVENTION

During the past several years, different methods have been tried to improve the integrity of sapphire used in high pressure fluid and/or water jets. These high pressure fluid jets are used, for example, to cut stone, metal, leather, cloth, plastic and a whole range of other materials, both hard and soft, as well as to clean, blast and abrade various materials. Extremely high pressures may be used, and the sapphire fluid jet orifice may thus be subject to extreme conditions. Accordingly, the fluid jet orifices erode after time, and it has been a primary objective to obtain stronger and harder sapphire fluid jets which last longer. Methods which have been tried in the past include ion implantation, titanium mono-oxide treatment and annealing in various gas atmospheres.

SUMMARY OF THE INVENTION

It is, accordingly, an object of the present invention to provide a sapphire fluid jet orifice which is longer lasting, harder and more durable than those presently in use.

It is furthermore an object of the present invention to provide a method for making such a sapphire fluid jet orifice.

It is yet still a further object to provide a material for fluid jet orifices.

It has been discovered that high temperature oxygen annealing of sapphire for fluid jets under controlled conditions improves the hardness and strength of the fluid jet by 70-100%. This improvement in mechanical integrity produces longer life, high pressure fluid jet orifices.

The above and other objects of the invention are achieved by a fluid jet orifice comprising an orifice made of sapphire, the sapphire being annealed in a high temperature oxygen atmosphere. The temperature range for annealing is preferably from approximately 1200° C. to 1700° C. and the annealing times may be from approximately 4 to 40 hours. The oxygen atmosphere pressure preferably is at or above atmospheric.

The above and other objects of the invention are also achieved by a fluid jet orifice made by the process comprising the steps of providing a sapphire fluid jet orifice having oxygen vacancies within its crystal structure and exposing the sapphire containing said oxygen vacancies to a high temperature oxygen atmosphere, causing oxygen to diffuse into the oxygen vacancies.

The above and other objects of the invention are furthermore achieved by a method for making a fluid jet orifice comprising the steps of providing a sapphire fluid jet orifice having oxygen vacancies within its crystal structure and exposing the sapphire having said oxygen vacancies to a high temperature oxygen atmosphere causing oxygen to diffuse into the oxygen vacancies.

The above and other objects of the invention are also achieved by a material for a fluid jet orifice comprising a sapphire material, the sapphire material being annealed in a high temperature oxygen atmosphere.

Other features and advantages of the present invention will become apparent from the following description of the invention which refers to the accompanying drawings.

DETAILED DESCRIPTION OF THE INVENTION

Sapphire ($AL_2O_3$) is 100% single crystal aluminum oxide ($AL_2O_3$). During a known process (the "HEM process") for producing sapphire, sapphire is grown in a vacuum. During this growth process, the sapphire can become oxygen depleted, due to the vacuum, leaving oxygen vacancies within the crystal structure. Exposure of sapphire to a high temperature oxygen atmosphere causes oxygen to diffuse into the oxygen vacancies. This diffusion is a bulk process throughout the sapphire crystal, i.e., not a surface treatment. Subsequent mechanical testing of the resulting sapphire crystals revealed hardness increases of 50-100% and tensile strength increases of the same magnitude.

Subsequent testing of sapphire high pressure fluid jet orifices after oxygen annealing revealed longer lasting, harder, tougher orifices.

This process provides improved sapphire orifices for high pressure fluid jets due to improvement in hardness and tensile strength. It provides this improvement at a very cost effective level due to the bulk nature of high temperature annealing. Suitable temperatures for the oxygen annealing process are in the range from approximately 1200° C. to 1700° C., for time periods of approximately 4 hours to 40 hours, with the longer annealing times generally required for temperatures at the lower end of the range. Once the sapphire is saturated with oxygen, the annealing can be terminated. This is a function of the annealer's judgment, based upon the annealing environmental conditions. The oxygen should be very pure to avoid impurities diffusing into the crystal, and the pressure of the oxygen atmosphere should be atmospheric or above.

As discussed, a preferred growth method for the sapphire used according to the invention is sapphire grown by the heat exchange method (HEM). In this growth method, sapphire is grown in a vacuum.

Once the sapphire is grown, it is machined into the shape of a fluid jet nozzle orifice, by known means, and thereafter subjected to the annealing process according to the invention. Because the annealing process of the invention significantly hardens the sapphire, all machining and forming should preferably be done before the annealing step.

In order to perform the annealing step, the sapphire grown in the vacuum is placed into a high temperature oven set to a temperature in the range described above, in an oxygen atmosphere as described and for a time determined by the temperature and the sapphire used. Although sapphire grown by the HEM method is preferable, sapphire grown by other methods can also be used. The results are sapphire fluid jet orifices having extremely high strength, hardness and durability.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A fluid jet orifice comprising an orifice made of sapphire, the sapphire being made by the HEM process and thereafter being annealed in a high temperature oxygen atmosphere to cause oxygen to diffuse into oxygen vacancies in the sapphire.

2. The fluid jet orifice recited in claim 1, wherein the high temperature is in the range of approximately 1200° C. to 1700° C., the pressure of the oxygen atmosphere is at least atmospheric, and the annealing time is from approximately 4 to 40 hours.

3. A fluid jet orifice made by the process comprising the steps of:
provproviding a sapphire fluid jet made by the HEM process and having oxygen vacancies within its crystal structure; and
annealing the sapphire by exposing the sapphire containing said oxygen vacancies to a high temperature oxygen atmosphere, causing oxygen to diffuse into the oxygen vacancies.

4. The fluid jet orifice made by the process recited in claim 3, wherein the high temperature is in the range of approximately 1200° C. to 1700° C., the pressure of the oxygen atmosphere is at least atmospheric and the annealing time is from approximately 4 to 40 hours.

5. A method for making a fluid jet orifice comprising the steps of:
providing a sapphire fluid jet orifice made by the HEM process and having oxygen vacancies within its crystal structure; and
annealing the sapphire by exposing the sapphire having said oxygen vacancies to a high temperature oxygen atmosphere causing oxygen to diffuse into the oxygen vacancies.

6. The method recited in claim 5, wherein the high temperature is in a range of approximately 1200° C. to 1700° C., the oxygen atmosphere is at a pressure of at least atmospheric, and the annealing time is from approximately 4 to 40 hours.

7. A material for a fluid jet orifice comprising a sapphire material made by the HEM process, the sapphire material thereafter being annealed in a high temperature oxygen atmosphere to cause oxygen to diffuse into oxygen vacancies in the sapphire.

8. The material recited in claim 7, wherein the high temperature is in a range of approximately 1200° C. to 1700° C., the pressure of the oxygen atmosphere is at least atmospheric and the annealing time is from approximately 4 to 40 hours.

9. A method for making a hardened fluid jet orifice comprising the steps of:
providing a sapphire fluid jet orifice made by the HEM process; and
annealing the sapphire by exposing the sapphire to a high temperature oxygen atmosphere to cause oxygen to diffuse into oxygen vacancies in the sapphire to provide said hardened fluid jet orifice.

10. The method recited in claim 9, wherein the high temperature is in a range of approximately 1200° C. to 1700° C., the oxygen atmosphere is at a pressure of at least atmospheric, and the annealing time is from approximately 4 to 40 hours.

* * * * *